United States Patent
Yoshida (10) Patent No.: US 6,538,361 B2
(45) Date of Patent: Mar. 25, 2003

(54) PIEZOELECTRIC OSCILLATOR

(75) Inventor: Ryuhei Yoshida, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 34 days.

(21) Appl. No.: 09/908,128

(22) Filed: Jul. 18, 2001

(65) Prior Publication Data

US 2002/0057039 A1 May 16, 2002

(30) Foreign Application Priority Data

Aug. 9, 2000 (JP) ........................................ 2000-241548

(51) Int. Cl.[7] .......................... H03H 9/19; H01L 41/047
(52) U.S. Cl. ...................... 310/320; 310/348; 310/366
(58) Field of Search ................................ 310/320, 348, 310/349, 366

(56) References Cited

U.S. PATENT DOCUMENTS

| | | | | |
|---|---|---|---|---|
| 6,232,699 | B1 | * | 5/2001 | Wajima ........................ 310/320 |
| 6,369,487 | B1 | * | 4/2002 | Kameda et al. ............... 310/320 |
| 2001/0030490 | A1 | * | 10/2001 | Wajima et al. ............... 310/366 |

FOREIGN PATENT DOCUMENTS

| | | | | |
|---|---|---|---|---|
| JP | 4-192709 | | 7/1992 | ............ H03H/9/02 |
| JP | 5-18120 | | 3/1993 | ............ H03H/9/02 |
| JP | 11-317335 | * | 11/1999 | ............ H01G/17/00 |
| JP | 2000-286665 | * | 10/2000 | ............ H03H/9/17 |
| JP | 2001-57515 | * | 2/2001 | ............ H03H/9/17 |

* cited by examiner

Primary Examiner—Thomas M. Dougherty
(74) Attorney, Agent, or Firm—Keating & Bennett, LLP (57) ABSTRACT

A piezoelectric oscillator is constructed to prevent deterioration of frequency accuracy caused by external-capacitance variations to maintain a high degree of frequency accuracy. Additionally, an undesired short-circuit is prevented from occurring even when the height of the oscillator is reduced. In this oscillator, on an upper surface of a capacitor substrate only first and second external electrodes connected to a piezoelectric resonator are provided. The piezoelectric resonator connects to the external electrodes. A parallel capacitance section for loading capacitance in parallel to the piezoelectric resonator is connected between the first and second external electrodes. Additionally, load capacitance sections for interposing load capacitances are connected between the first external electrode and a third external electrode and between the second and third external electrodes. The parallel capacitance section and the pair of load capacitance sections are contained in the capacitor substrate.

20 Claims, 7 Drawing Sheets

PIEZOELECTRIC OSCILLATOR

BACKGROUND OF THE INVENTION

1. Field of the Invention

The present invention relates to piezoelectric oscillators in which piezoelectric resonators and capacitors are combined. More particularly, the present invention relates to piezoelectric oscillators having piezoelectric resonators connected to load capacitances and parallel capacitances.

2. Description of the Related Art

Conventionally, piezoelectric oscillators have been widely used to obtain oscillation frequencies for clock circuits or other suitable devices. In such piezoelectric oscillators, outstanding frequency accuracy and reliability are required.

Figure 7:
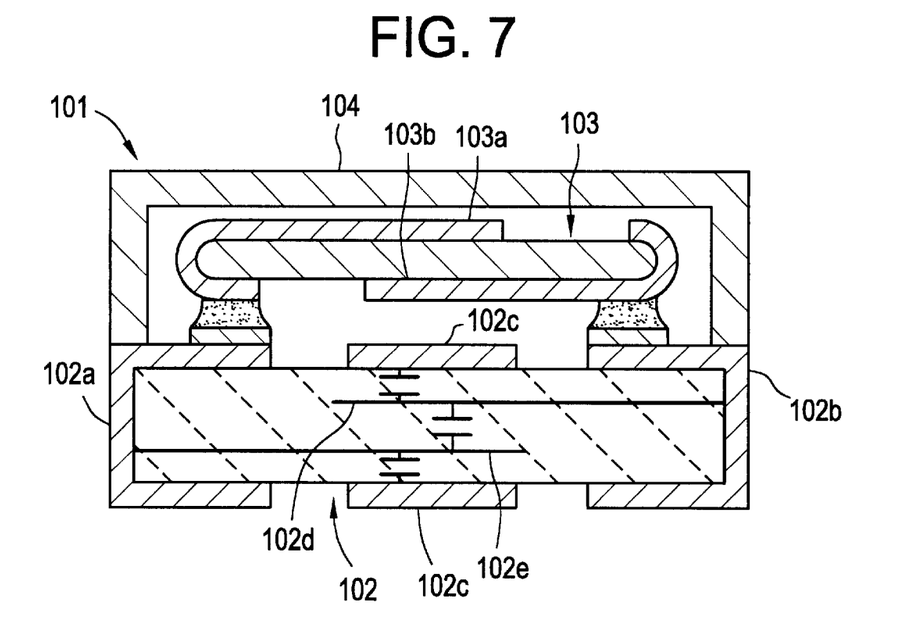
FIG. 7 shows a sectional view of a conventional piezoelectric oscillator.

Japanese Unexamined Utility Model Application Publication No. 5-18120 provides a piezoelectric oscillator. FIG. 7 shows a sectional view of the piezoelectric oscillator. In this figure, a piezoelectric oscillator 101 includes a piezoelectric resonator 103 mounted on a capacitor substrate 102. The piezoelectric resonator 103 is enclosed by a cap 104. External electrodes 102a to 102c are provided on outer surfaces of the capacitor substrate 102. The external electrodes 102a and 102b are provided on each end surface of the capacitor substrate 102. The portions of the external electrodes 102a and 102b that extend to the upper surface of the capacitor substrate 102 are electrically connected to vibration electrodes 103a and 103b of the piezoelectric resonator 103.

Internal electrodes 102d and 102e are provided inside the capacitor substrate 102. The internal electrodes 102d and 102e are arranged to overlap each other via a dielectric layer. The internal electrode 102d is connected to the external electrode 102b and the internal electrode 102e is connected to the external electrode 102a. The external electrode 102c extends from the upper surface of the capacitor substrate 102 to the lower surface through a pair of side surfaces of the substrate 102. In addition, the external electrode 102 overlaps with the external electrode 102d and 102e via a dielectric layer.

Figure 8:
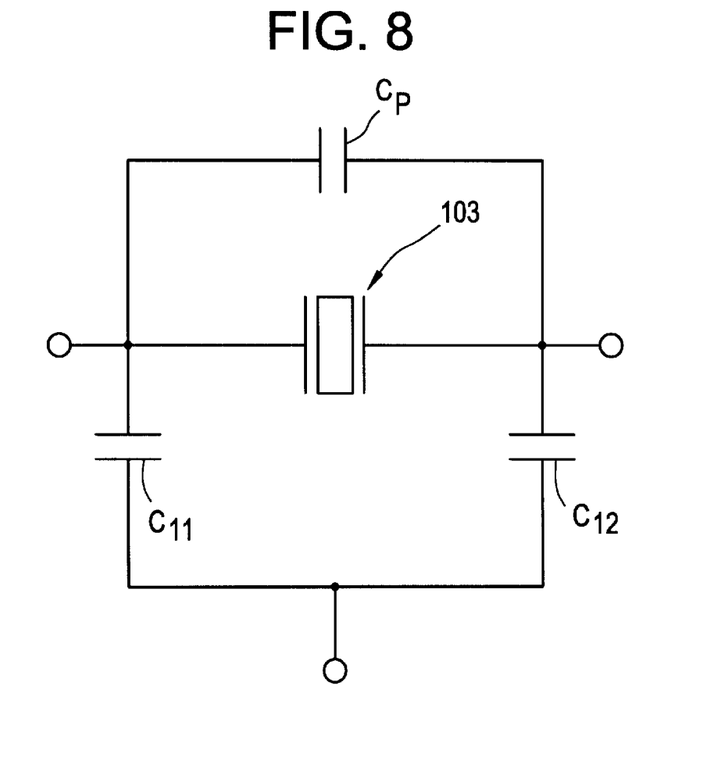
FIG. 8 shows the circuit structure of the conventional piezoelectric oscillator shown in FIG. 7.

With the above arrangement, a parallel capacitance $C_p$ is provided between the external electrodes 102a and 102b based on the dielectric layer between the internal electrodes 102d and $102_e$. In addition, a load capacitance $C_{11}$ is provided between the internal electrode 102d and the external electrode 102c and a load capacitance $C_{12}$ is provided between the internal electrode 102e and the external electrode 102c. FIG. 8 shows the circuit structure of the piezoelectric oscillator 101.

In the piezoelectric oscillator 101, the parallel capacitance $C_p$ is connected in parallel to the piezoelectric resonator 103. Thus, by adjusting the magnitude of the parallel capacitance $C_p$, a spurious response occurring between a resonance frequency and an anti-resonance frequency can be shifted. As a result, spurious responses occurring on the high frequency side can be suppressed.

Figure 9:
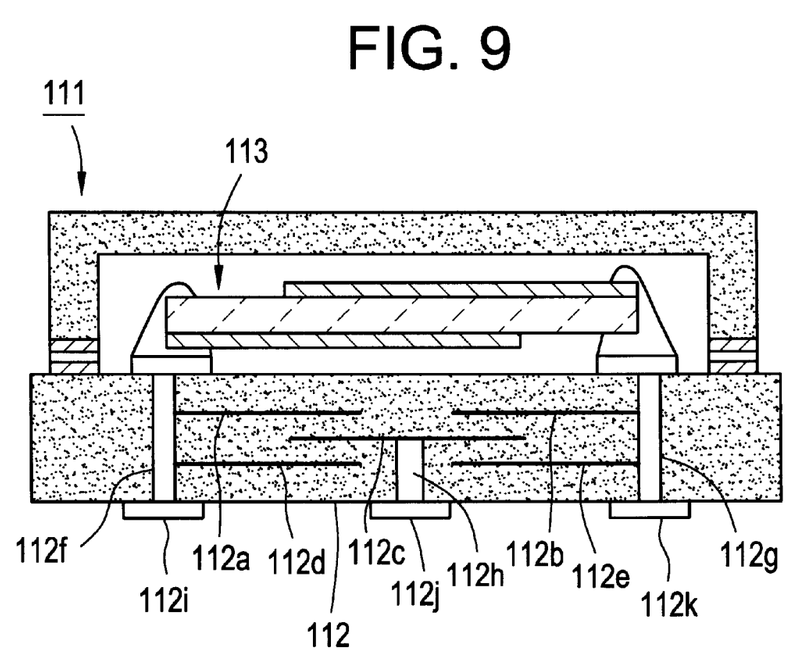
FIG. 9 shows a sectional view for illustrating another conventional piezoelectric oscillator.

Furthermore, Japanese Unexamined Patent Application Publication No. 4-192709 provides a piezoelectric oscillator, which is shown in FIG. 9. In a piezoelectric oscillator 111, a piezoelectric resonator 113 is mounted on a capacitor substrate 112. The piezoelectric resonator 113 is enclosed by a cap 114. A plurality of internal electrodes 112a to 112e are provided inside the capacitor substrate 112. The internal electrodes 112a and 112b oppose each other via a predetermined distance at the same height position. The internal electrode 112a is connected to a via-hole electrode 112f and the internal electrode 112b is connected to a via-hole electrode 112g. Similarly, the internal electrodes 112d and 112e oppose each other at the same height position and the internal electrode 112d is connected to the via-hole electrode 112f and the internal electrode 112e is connected to the via-hole electrode 112g.

The internal electrode 112c is arranged to overlap the internal electrodes 112a, 112b, 112d, and 112e via dielectric layers. The internal electrode 112c is connected to a via-hole electrode 112h. The via-hole electrodes 112f to 112h extend to the lower surface of the capacitor substrate 112. External electrodes 112i to 112k are provided on the lower surface of the capacitor substrate 112 to be electrically connected to the outside. The external electrodes 112i to 112k are connected to the via-hole electrodes 112f to 112h.

In the piezoelectric oscillator 111, the internal electrodes 112a to 112e are provided inside the capacitor substrate 112, and a load capacitance is thereby connected to the piezoelectric resonator 113. In this oscillator 111, since the external electrodes 112i to 112k are provided on the lower surface of the capacitor substrate 112, the lower-surface side of the capacitor substrate 112 can be mounted on a printed circuit board.

Recently, in such a piezoelectric oscillator, as in other kinds of electronic devices, miniaturization, and particularly, height reduction has been strongly demanded. When a piezoelectric oscillator is miniaturized, the size of a piezoelectric resonator used in the oscillator is also reduced. As a result, a vibration-electrode facing area in the piezoelectric resonator is reduced. Consequently, a capacitance $C_f$ between terminals in the piezoelectric resonator is reduced. For example, when the piezoelectric resonator is made of a ceramic material including Pb having a high Q factor, since the relative bandwidth is broadened, the frequency accuracy varies due to variations in the magnitudes of external capacitances with respect to the piezoelectric resonator.

As the piezoelectric ceramic defining the piezoelectric resonator becomes finer and stronger, the high frequency characteristics are greatly improved. However, with the high frequency characteristics improved, high-order mode spurious responses such as a third harmonic and a fifth harmonic causing abnormal oscillation are substantially increased. Thus, such high order mode spurious responses must be suppressed.

In addition, as the height of the oscillator is reduced, the thickness of a gap between the piezoelectric resonator and the capacitor substrate on which the piezoelectric resonator is mounted is reduced to a few $\mu$m. As a result, for example, in the oscillator as described in Japanese Unexamined Utility Model Application Publication No. 5-18120, when the piezoelectric resonator 103 resonates, the vibration electrodes which extend on the lower surface of the piezoelectric resonator 103 come in contact with the external electrode 102b connected to a ground potential on the capacitor substrate and are eventually short-circuited.

In the piezoelectric oscillator 111 described in Japanese Unexamined Patent Application Publication No. 4-192709, no external electrode is provided on the upper surface of the capacitor substrate 112. Thus, when the height of the oscillator is reduced, the above-mentioned short circuit does not occur. However, in the piezoelectric oscillator 111, as the size of the oscillator is reduced, as described above, the influences caused by the variations in external electrodes are greater. Thus, it is very difficult to improve the frequency accuracy. In addition, the influences of high order mode spurious responses including a third harmonic and a fifth harmonic are increased.

SUMMARY OF THE INVENTION

To overcome the above-described problems with the prior art, preferred embodiments of the present invention provide an improved piezoelectric oscillator. In this piezoelectric oscillator, since the deterioration of the frequency accuracy caused by variations in external capacitances is minimized, excellent frequency characteristics are obtained. Moreover, even when the height of the oscillator is reduced, undesired short circuits do not occur. Thus, the piezoelectric oscillator of preferred embodiments of the present invention has outstanding accuracy and reliability.

In addition to this, in the piezoelectric oscillator of preferred embodiments of the present invention, even when high frequency characteristics are greatly improved, higher order mode spurious responses causing abnormal oscillation are effectively minimized.

According to a preferred embodiment of the present invention, a piezoelectric oscillator includes a capacitor substrate having a first main surface and a second main surface, a pair of side surfaces, and a pair of end surfaces, first and second external electrodes including portions which extend to the first main surface of the capacitor substrate, a third external electrode which does not extend to the first main surface, a piezoelectric resonator mounted on the first main surface and electrically connected to the first and second external electrodes, a parallel capacitance section connected between the first and second external electrodes to load a capacitance in parallel to the piezoelectric resonator, and a pair of load capacitance sections for interposing a load capacitance between the first and third external electrodes and a load capacitance between the second and third external electrodes, in which the parallel capacitance section and the pair of load capacitance sections are contained inside the capacitor substrate.

In this oscillator, as capacitance-frequency characteristics of the parallel capacitance section are present in a higher frequency position, the value of tanδ is greater.

In addition, the parallel capacitance section and the pair of load capacitance sections are preferably defined by a plurality of internal electrodes overlapping each other in the thickness direction of the capacitor substrate via dielectric layers defining the capacitor substrate.

In addition, the relative permittivity of the dielectric layer in the parallel capacitance section differs from the relative permittivities of the dielectric layers in the load capacitance sections.

Additionally, the piezoelectric oscillator further includes a cap attached to the first main surface of the capacitor substrate to enclose the piezoelectric resonator mounted on the first main surface.

Furthermore, this oscillator preferably further includes a frame-shaped insulation layer provided on the first main surface of the capacitor substrate to mount the piezoelectric resonator.

In addition, the first and second external electrodes extend from the first main surface of the capacitor substrate to the pair of side surfaces thereof, and the third external electrode is provided on the pair of side surfaces.

In addition, in this oscillator, the first to third external electrodes preferably extend to the second main surface of the capacitor substrate.

Other features, elements, characteristics and advantages of the present invention will become apparent from the following detailed explanations of preferred embodiments of the present invention with reference to the drawings.

DETAILED DESCRIPTION OF PREFERRED EMBODIMENTS

With reference to the drawings, the present invention will be described by explaining preferred embodiments of the present invention.

Figure 1:
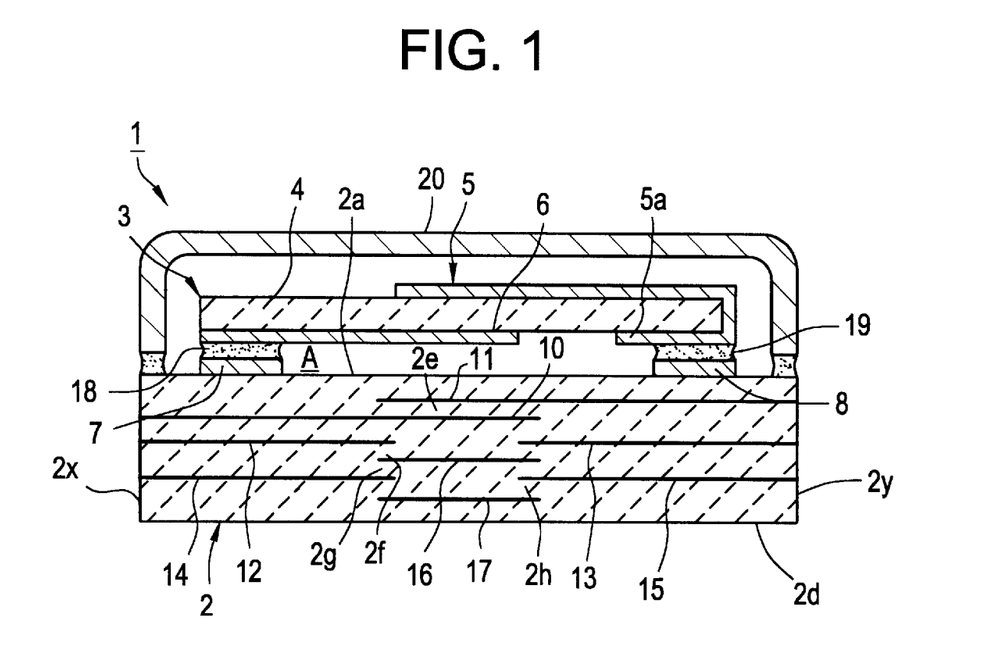
FIG. 1 hows a longitudinal cross section of a piezoelectric oscillator according to a first preferred embodiment of the present invention.
Figure 2:
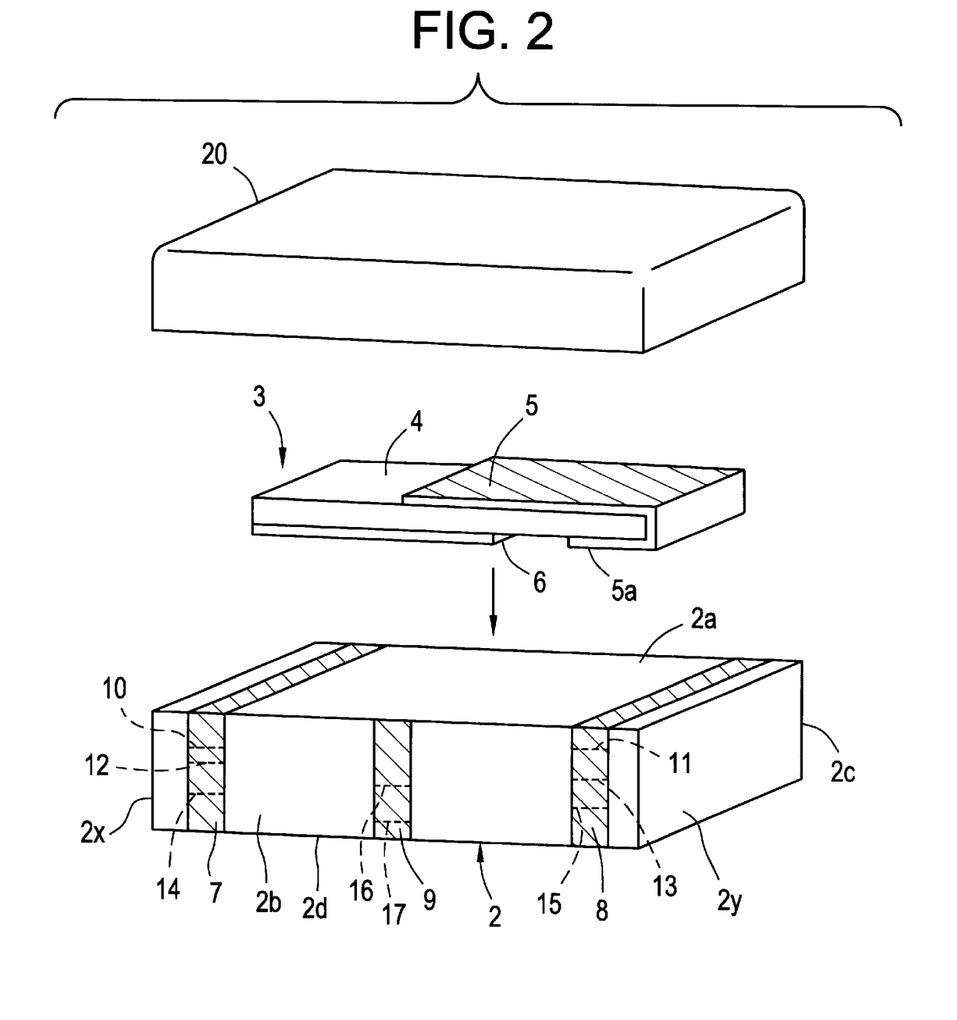
FIG. 2 shows an exploded perspective view of the piezoelectric oscillator according to the first preferred embodiment of the present invention.

FIG. 1 shows a sectional view of a piezoelectric oscillator according to a first preferred embodiment of the present invention. FIG. 2 shows an exploded perspective view of the piezoelectric oscillator of the first preferred embodiment of the present invention.

As shown in each of FIGS. 1 and 2, in a piezoelectric oscillator 1 according to the first preferred embodiment, a piezoelectric resonator 3 is mounted on an upper surface 2a defining a first main surface of a capacitor substrate 2, preferably having a substantially rectangular-planar shape.

The piezoelectric resonator 3 of the first preferred embodiment is preferably an energy-trap type piezoelectric resonator utilizing a thickness-shear mode. As shown in FIG. 2, the piezoelectric resonator 3 includes a piezoelectric substrate 4 preferably having a substantially rectangular planar shape. The piezoelectric substrate 4 is preferably made of a piezoelectric ceramic, such as lead titanate or lead zirconate titanate, or made of a piezoelectric single crystal. The piezoelectric substrate 4 is polarized in a direction that is substantially parallel to its lengthwise direction.

On the upper surface of the piezoelectric substrate 4, a first vibration electrode 5 is provided. On the lower surface of the substrate 4, a second vibration electrode 6 is provided. The vibration electrodes 5 and 6 oppose each other via the piezoelectric substrate 4 in the approximate center of the lengthwise direction of the piezoelectric substrate 4. The portion where the vibration electrodes 5 and 6 oppose each other via the piezoelectric substrate 4 defines an energy-trapping type piezoelectric oscillation section.

The vibration electrode 5 extends from the approximate center of the upper surface of the piezoelectric substrate 4 to the lower surface through one end surface of the substrate 4. In addition, the vibration electrode 6 extends from the approximate center of the lower surface of the piezoelectric substrate 4 to the other end surface thereof.

The capacitor substrate 2 is preferably formed by a known technology in which multi-layered ceramics are integrally fired.

Specifically, the capacitor substrate 2 is made of an appropriate dielectric ceramic. The substrate 2 includes first and second external electrodes 7 and 8 extending from the upper surface 2a to a lower surface 2d through a pair of side surfaces 2b and 2c. In addition, a third electrode 9 extends from the pair of side surfaces 2b and 2c of the capacitor substrate 2 to the lower surface 2d. The external electrodes 7 and 8 are preferably located close to end surfaces 2x and 2y of the capacitor substrate 2, and the external electrode 9 is provided in the approximate central area between the end surfaces 2x and 2y. In the upper portion inside the capacitor substrate 2, a plurality of internal electrodes 10 and 11 are provided and define a parallel capacitance section. The internal electrodes 10 and 11 overlap each other via a dielectric layer 2e. The internal electrode 10 extends to the side surfaces 2b and 2c of the capacitor substrate 2. The portions where the internal electrode 10 extends to the side surfaces 2b and 2c are electrically connected to the first external electrode 7. Similarly, the internal electrode 11 includes portions extending to the side surfaces 2b and 2c, which are electrically connected to the second external electrode 8. Consequently, between the first and second external electrodes 7 and 8, a capacitance is interposed based on the dielectric layer 2e between the internal electrodes 10 and 11. The capacitance defines the parallel capacitance section according to preferred embodiments of the present invention.

Below the internal electrodes 10 and 11, a plurality of internal electrodes 12 to 17 is provided. Top ends of the internal electrodes 12 and 13 oppose each other via a predetermined distance at the same height position inside the capacitor substrate 2. The internal electrodes 12 and 13 have portions extending to the side surfaces 2b and 2c, and the extending portions of the internal electrodes 12 and 13 are electrically connected to the external electrodes 7 and 8. The internal electrode 16 overlaps the internal electrodes 12 and 13 via a dielectric layer 2f. Portions of the internal electrode 16 that extend to the side surfaces 2b and 2c are electrically connected to the third external electrode 9.

Below the internal electrode 16, the internal electrodes 14 and 15 are provided at the same height position. Top end portions of the internal electrodes 14 and 15 oppose each other via a predetermined distance. Portions of the internal electrode 14 that extend to the side surfaces 2b and 2c are electrically connected to the first external electrode 7. Portions of the internal electrode 15 that extend to the side surfaces 2b and 2c are electrically connected to the second external electrode 8.

The internal electrode 17 is located in a position lower than the position where the internal electrodes 14 and 15 are provided. The internal electrode 17 is arranged in the same manner as the internal electrode 16.

Specifically, between the first external electrode 7 and the third external electrode 9, a capacitance is interposed based on the dielectric layers 2f to 2h at portions where the internal electrodes 12 and 14 overlap the internal electrodes 16 and 17. The capacitance defines one of the load capacitance sections according to preferred embodiments of the present invention. Similarly, between the internal electrodes 16 and 17 and the internal electrodes 13 and 15, a capacitance is provided based on the dielectric layers 2f to 2h. The capacitance defines the other load capacitance section according to preferred embodiments of the present invention.

As a result, the load capacitance sections are provided between the external electrodes 7 and 9 and between the external electrodes 8 and 9.

Figure 3:
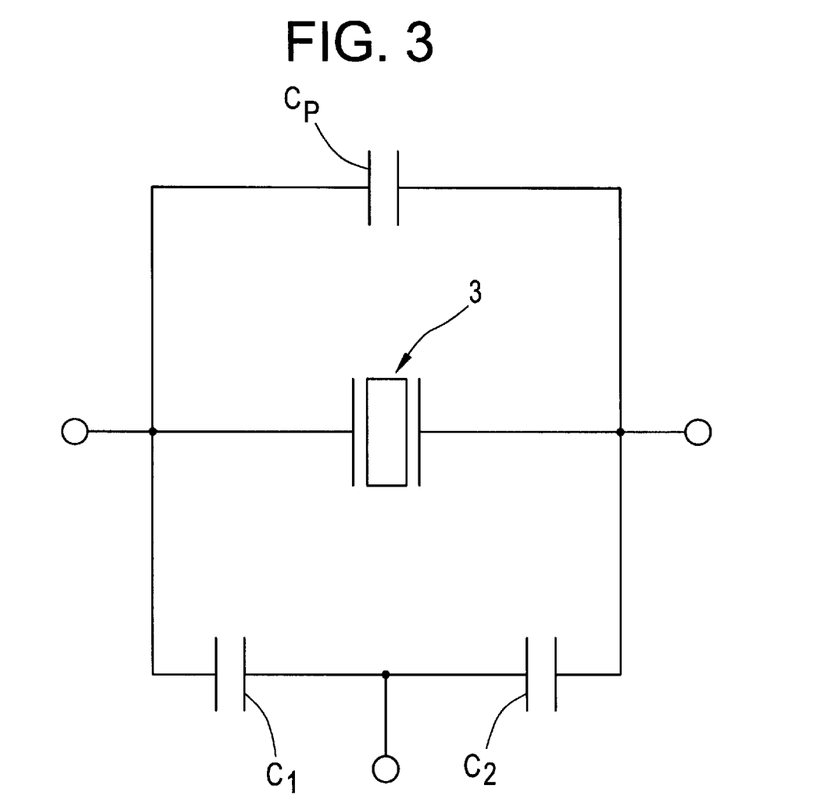
FIG. 3 shows the circuit structure of the piezoelectric oscillator according to the first preferred embodiment of the present invention.

FIG. 3 shows the circuit structure of the piezoelectric oscillator 1 of the first preferred embodiment of the present invention.

As shown in FIG. 3, a capacitance $C_p$ based on the parallel capacitance section is connected in parallel to the piezoelectric oscillator 1. In addition, load capacitances $C_1$ and $C_2$ based on first and second load capacitance sections are connected between input/output terminals and a ground potential in the piezoelectric oscillator.

In this preferred embodiment, the piezoelectric resonator 3 is connected to the external electrodes 7 and 8 via conductive adhesive members 18 and 19. The conductive adhesive member 19 connects a portion 5a of the vibration electrode 5 extending to the lower surface of the piezoelectric substrate 4 to the external electrode 8.

In addition, to enclose the piezoelectric resonator 3, a metal cap 20 is fixed to the capacitor substrate 2 with an insulative adhesive 21.

In the piezoelectric oscillator 1, the first and second external electrodes 7 and 8 are provided on the upper surface 2a of the capacitor substrate 2, and the third external electrode 9 is not provided thereon. Thus, when the oscillator is miniaturized and the height of the oscillator is reduced, even though a gap A between the piezoelectric resonator 3 and the upper surface 2a of the capacitor substrate 2 is reduced, the vibration electrode 6 does not come in contact with the third external electrode 9 connected to a ground potential. As a result, the oscillator can be miniaturized, and particularly, the height of the oscillator can be greatly reduced.

Furthermore, inside the capacitor substrate 2, the parallel capacitance $C_p$ and the load capacitances $C_1$ and $C_2$ are provided as shown in FIG. 3. With the parallel capacitance $C_p$ of the parallel capacitance section, an anti-resonance frequency decreases. Consequently, the bandwidth $\Delta F$ is reduced. The bandwidth $\Delta F$ is obtained by an equation $\Delta F = Fa - Fr$, where, Fa denotes an anti-resonance frequency and Fr denotes a resonance frequency. That is, a narrowed bandwidth is obtained.

A capacitance $C_F$ between the input/output terminals is obtained by an equation $C_F = C_0 + C_p$ ($C_0 = C_1 + C_2$). Even when the capacitance between the terminals of the piezoelectric resonator 3 is reduced due to miniaturization of the oscillator, an apparent capacitance between the input/output terminals is increased. Consequently, since influences caused by an external capacitance such as a floating capacitance is suppressed, the frequency accuracy of the oscillator 1 is greatly increased.

Furthermore, when using a fundamental mode of the piezoelectric resonator 3, in a frequency position on the high frequency side where harmonics such as a third harmonic and a fifth harmonic are generated, the value of $C_1/C_0$ is originally smaller than the case of a fundamental wave and loss occurs due to resistance and inductance in the parallel capacitance $C_p$. Thus, in high-order modes, an anti-resonance is effectively removed. As a result, abnormal oscillation due to harmonics is greatly suppressed.

Figure 4:
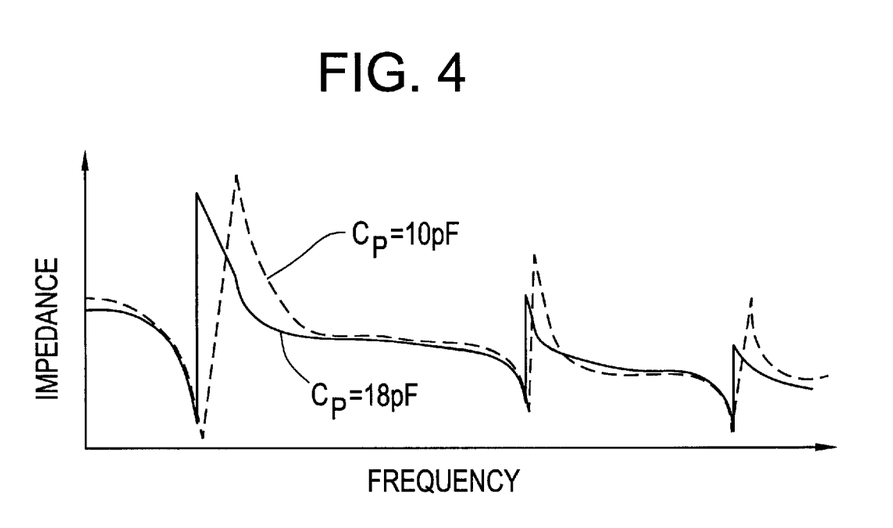
FIG. 4 shows a graph illustrating changes between impedances and frequency characteristics in the piezoelectric oscillator according to the first preferred embodiment when the magnitude of a parallel capacitance is changed.

FIG. 4 shows a graph for illustrating the impedance-frequency characteristics (broken line) of the piezoelectric oscillator 1 when the parallel capacitance $C_p$ is 10 pF, and the impedance-frequency characteristics (solid line) when the parallel capacitance $C_p$ is 18 pF.

As shown in FIG. 4, as the piezoelectric resonator 3, a piezoelectric resonator is provided which uses a fundamental mode of 4 MHz band in which the capacitance $C_F$ between input/output terminals is 12.8 pF and the bandwidth ΔF is 300 kHz. When the parallel capacitance $C_p$ is 10 pF, the bandwidth ΔF is 160 kHz, and when the parallel capacitance $C_P$ is 18 pF, the bandwidth ΔF is 118 kHz. Thus, by increasing the parallel capacitance $C_p$, the bandwidth is narrower. In addition, as mentioned above, when the parallel capacitance $C_p$ is increased up to 18 pF from 10 pF, a phase $\theta_3$ representing the magnitude of the spurious response of a third harmonic is reduced from 70° to 20°. As a result, spurious responses due to high order modes are greatly suppressed.

In addition, preferably, the relative permittivity of the dielectric layer of the parallel capacitance section is differentiated from the relative permittivity of each dielectric layer of the load capacitance sections. With this arrangement, the value of the parallel capacitance $C_p$ of the parallel capacitance section and the values of the capacitances $C_1$ and $C_2$ of the load capacitance sections are optimized. As a result, outstanding frequency characteristics are obtained and spurious responses caused by high order modes are more effectively suppressed.

For example, when the relative permittivity of the dielectric layer of the parallel capacitance section is greater than the relative permittivities of the dielectric layers in the load capacitance sections, even though a small number of dielectric layers are arranged between the internal electrodes, a large amount of capacitance is produced in the parallel capacitance section. In contrast, when the relative permittivity of the dielectric layer of the parallel capacitance section is less than that of the dielectric layer of the load capacitance section and the internal-electrode facing area in the parallel capacitance section is greater, capacitance variations due to variations in the internal-electrode facing area are greatly suppressed. Additionally, the accuracy of the parallel capacitance $C_p$ is greatly increased. As a result, band variations in the piezoelectric oscillator 1 are reduced. That is, the accuracy of an oscillation frequency is greatly improved.

Figure 5:
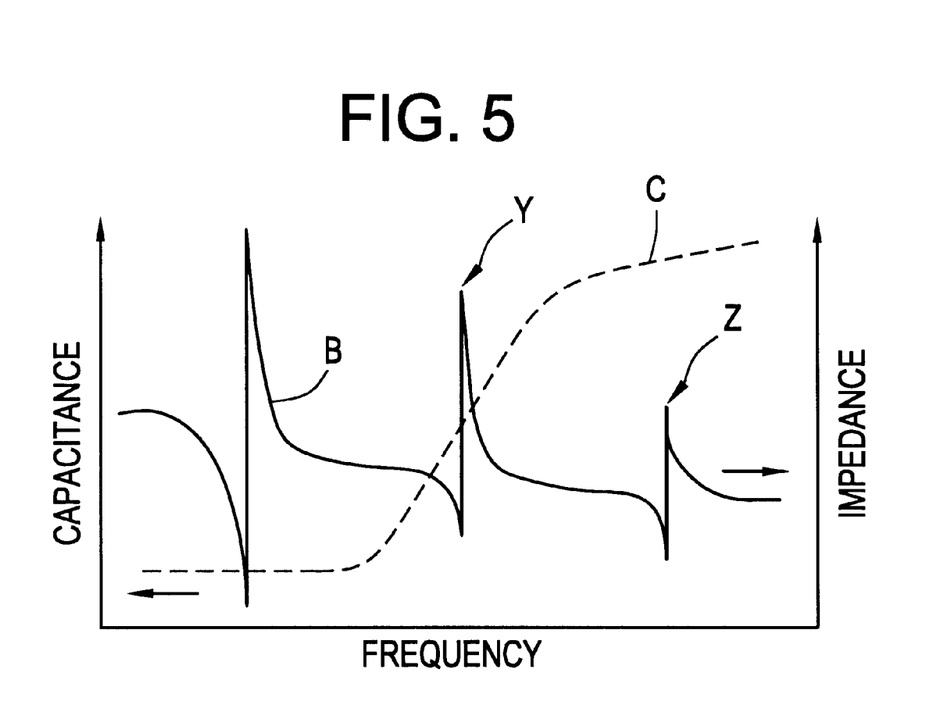
FIG. 5 shows a combination of the impedance-frequency characteristics of a piezoelectric resonator and the tan δ frequency characteristics of a parallel capacitance used in a modified example of the first preferred embodiment.

Furthermore, preferably, as shown in FIG. 5, when the frequency characteristics of the parallel capacitance $C_p$ are configured such that the value of tan δ is greater on the higher frequency side, spurious responses occurring on the high frequency region are minimized. In other words, when the impedance-frequency characteristics of the piezoelectric resonator 3 appear as shown by the solid line B in FIG. 5, by setting the frequency characteristics of the parallel capacitance section as shown by the broken line C, the oscillation conditions of a third-order mode and a fifth-order mode indicated by arrows Y and Z are removed. Thus, high-order mode spurious responses are more effectively suppressed.

As a dielectric material having the characteristics in which the value of tan δ increases when directing toward the high frequency side from the low frequency side, for example, there are listed $BaTiO_3$—$CaTiO_3$—Nb—Co—Nd, $BaTiO_3$—$CaTiO_3$—Bi—Sn, and other suitable materials.

In this case, even when the parallel capacitance $C_p$ is less than the capacitance between the input/output terminals of the piezoelectric resonator 3 such that it is difficult to narrow the bandwidth, the frequency characteristics of the parallel capacitance enables high order mode spurious responses to be effectively suppressed.

Figure 6:
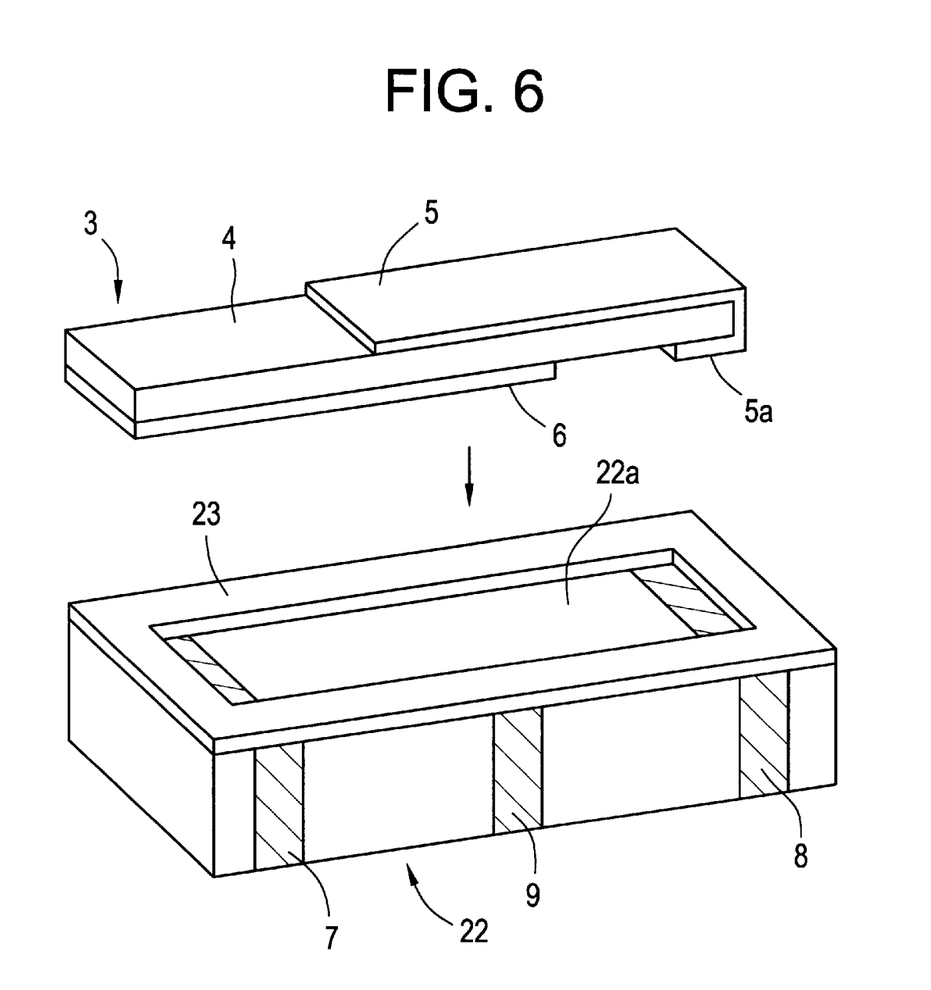
FIG. 6 shows an exploded perspective view for illustrating a piezoelectric oscillator according to a second preferred embodiment of the invention.

FIG. 6 shows a perspective view for illustrating a capacitor substrate used in the piezoelectric oscillator according to a second preferred embodiment of the present invention.

On an upper surface 22a of a capacitor substrate 22, an insulation layer 23 is provided which has a substantially rectangular frame shape. Except for the insulation layer 23 being provided, the capacitor substrate 22 is configured in the same manner as the capacitor substrate 2 of the first preferred embodiment.

A piezoelectric resonator 3 is mounted on the substantially rectangular-frame-shaped insulation layer 23. Vibration electrodes 5 and 6 included in the piezoelectric resonator 3 are connected to external electrodes 7 and 8 via a conductive adhesive. The thickness of the conductive adhesive is greater than that of the insulation layer 23. Thus, the lower surface of the piezoelectric resonator 3 is spaced from the upper surface 22a of the capacitor substrate 22, that is, a region surrounded by the insulation layer 23 by the thickness of the insulation layer 23. As a result, as compared with the first preferred embodiment, an undesired short circuit is more reliably prevented.

A cap member is attached to the insulation layer 23 near the external periphery of the insulation layer 23 with a conductive adhesive.

In each of the above first and second preferred embodiments, the piezoelectric resonator 3 is preferably a energy-trap-type piezoelectric resonator utilizing a thickness-shear mode. However, piezoelectric resonators utilizing other vibration modes can be applied to the present invention. In addition, the piezoelectric resonator used in the present invention in not necessarily an energy-trap-type piezoelectric resonator.

Furthermore, in the first preferred embodiment, the first to third external electrodes 7 to 9 preferably extend through the pair of side surfaces of the capacitor substrate 2 to the lower surface thereof. However, the first to third external electrodes 7 to 9 do not have to extend to the lower surface of the capacitor substrate.

As described above, on the first main surface of the capacitor substrate, the first and second external electrodes are provided and the third external electrode is not provided. The piezoelectric resonator is electrically connected to the first and second external electrodes. In this arrangement, even when the gap between the piezoelectric resonator and the first main surface of the capacitor substrate is reduced, an undesired short circuit is prevented without fail. As a result, the size of the piezoelectric oscillator, particularly, its height is greatly reduced.

In addition, with the parallel capacitance section connected between the first and second external electrodes, a capacitance is loaded in parallel to the piezoelectric resonator, the bandwidth is narrower and variations in the frequency accuracy caused by an external capacitance are prevented. Moreover, since high order mode spurious responses are effectively prevented, abnormal oscillation caused by high order modes is also prevented.

Particularly, when the capacitance frequency characteristics of the parallel capacitance section are arranged such that the value of tan δ is greater in the higher frequency side, high order mode spurious responses are effectively prevented on the high frequency side.

When the parallel capacitance section and the pair of load capacitance sections are defined by the plurality of internal electrodes overlapping each other in the thickness direction via dielectric layers defining the capacitor substrate, the parallel capacitance section and the load capacitance sections are provided with high accuracy by using the technology in which laminate ceramic layers are integrally fired. In addition, by adjusting the number of the overlapping internal electrodes stacked, desired capacitances are obtained without fail.

When the relative permittivity of the dielectric layer of the parallel capacitance section is different from the relative permittivity of each of the dielectric layers of the load capacitance sections, for example, when the relative permittivity of the dielectric layer of the dielectric layer in the parallel capacitance section is greater than those of the dielectric layers in the load capacitance sections, even though a smaller number of dielectric layers are arranged, a large amount of parallel capacitance is achieved. In contrast, when the relative permittivity of the dielectric layer in the parallel capacitance section is less than those of the dielectric layers in the load capacitance sections, the capacitance accuracy of the parallel capacitance is increased and the accuracy of an oscillation frequency is increased.

Since the cap is attached to the first main surface of the capacitor substrate to enclose the piezoelectric resonator, the piezoelectric resonator is contained inside the structure. Accordingly, the oscillator of the present invention obtains outstanding environmental resistance characteristics.

When the piezoelectric resonator is mounted on the first main surface of the capacitor substrate via the frame-shaped insulation layer, the gap between the piezoelectric resonator and the first main surface of the capacitor substrate is effectively maintained. Thus, an undesired short circuit is prevented without fail.

When the first and second external electrodes extend from the first main surface of the capacitor substrate to the pair of side surfaces thereof and the third external electrode is provided on the pair of side surfaces, by using the pair of side surfaces of the capacitor substrate, the piezoelectric oscillator of the present invention are easily mounted on a printed circuit board or other suitable mounting substrate. Particularly, when the first to third external electrodes also extend to the second main surface of the capacitor substrate, surface mounting of the oscillator is greatly facilitated.

While preferred embodiments of the invention have been described above, it is to be understood that various modification and changes will be apparent to those skilled in the art without departing the scope and spirit of the invention.

What is claimed is:

1. A piezoelectric oscillator comprising:
   a capacitor substrate having a first main surface and a second main surface, a pair of side surfaces, and a pair of end surfaces;
   first and second external electrodes including portions extending to the first main surface of the capacitor substrate;
   a third external electrode not extending to the first main surface;
   a piezoelectric resonator mounted on the first main surface and electrically connected to the first and second external electrodes;
   a parallel capacitance section connected between the first and second external electrodes to load a capacitance in parallel to the piezoelectric resonator; and
   a pair of load capacitance sections arranged to interpose a load capacitance between the first and third external electrodes and a load capacitance between the second and third external electrodes;
   wherein the parallel capacitance section and the pair of load capacitance sections are located inside of the capacitor substrate.

2. A piezoelectric oscillator according to claim 1, wherein as capacitance-frequency characteristics of the parallel capacitance section increase in frequency position, the value of tan δ increases.

3. A piezoelectric oscillator according to claim 1, wherein the capacitor substrate includes a plurality of dielectric layers and the parallel capacitance section and the pair of load capacitance sections are defined by a plurality of internal electrodes overlapping each other in the thickness direction of the capacitor substrate via the dielectric layers of the capacitor substrate.

4. A piezoelectric oscillator according to claim 3, wherein the relative permittivity of the dielectric layer in the parallel capacitance section differs from the relative permittivities of the dielectric layers in the load capacitance sections.

5. A piezoelectric oscillator according to claim 3, wherein the relative permittivity of the dielectric layer in the parallel capacitance section is greater than the relative permittivities of the dielectric layers in the load capacitance sections.

6. A piezoelectric oscillator according to claim 3, wherein the relative permittivity of the dielectric layer in the parallel capacitance section is less than the relative permittivities of the dielectric layers in the load capacitance sections.

7. A piezoelectric oscillator according to claim 1, further comprising a cap attached to the first main surface of the capacitor substrate to enclose the piezoelectric resonator mounted on the first main surface.

8. A piezoelectric oscillator according to claim 7, further comprising a frame-shaped insulation layer provided on the first main surface of the capacitor substrate to mount the piezoelectric resonator.

9. A piezoelectric oscillator according to claim 1, wherein the first and second external electrodes extend from the first main surface of the capacitor substrate to the pair of side surfaces thereof, and the third external electrode is provided on the pair of side surfaces.

10. A piezoelectric oscillator according to claim 9, wherein the first, second and third external electrodes extend to the second main surface of the capacitor substrate.

11. A piezoelectric oscillator according to claim 1, wherein said piezoelectric resonator is configured to be an energy-trap type piezoelectric resonator utilizing a thickness-shear mode.

12. A piezoelectric oscillator comprising:
   a capacitor substrate having a first main surface and a second main surface, a pair of side surfaces, and a pair of end surfaces;
   first and second external electrodes including portions extending to the first main surface of the capacitor substrate;
   a third external electrode not extending to the first main surface; and
   a piezoelectric resonator mounted on the first main surface and electrically connected to the first and second external electrodes.

13. The piezoelectric oscillator according to claim 12, further comprising:
   a parallel capacitance section connected between the first and second external electrodes to load a capacitance in parallel to the piezoelectric resonator; and a pair of load capacitance sections arranged to interpose a load capacitance between the first and third external electrodes and a load capacitance between the second and third external electrodes;

wherein the parallel capacitance section and the pair of load capacitance sections are located inside the capacitor substrate.

14. A piezoelectric oscillator according to claim 13, wherein the capacitor substrate includes a plurality of dielectric layers and the parallel capacitance section and the pair of load capacitance sections are defined by a plurality of internal electrodes overlapping each other in the thickness direction of the capacitor substrate via the dielectric layers of the capacitor substrate.

15. A piezoelectric oscillator according to claim 14, wherein the relative permittivity of the dielectric layer in the parallel capacitance section is greater than the relative permittivities of the dielectric layers in the load capacitance sections.

16. A piezoelectric oscillator according to claim 12, further comprising a cap attached to the first main surface of the capacitor substrate to enclose the piezoelectric resonator mounted on the first main surface.

17. A piezoelectric oscillator according to claim 16, further comprising a frame-shaped insulation layer provided on the first main surface of the capacitor substrate to mount the piezoelectric resonator.

18. A piezoelectric oscillator according to claim 12, wherein the first and second external electrodes extend from the first main surface of the capacitor substrate to the pair of side surfaces thereof, and the third external electrode is provided on the pair of side surfaces.

19. A piezoelectric oscillator according to claim 18, wherein the first, second and third external electrodes extend to the second main surface of the capacitor substrate.

20. A piezoelectric oscillator according to claim 12, wherein said piezoelectric resonator is configured to be an energy-trap type piezoelectric resonator utilizing a thickness-shear mode.

* * * * *